(12) United States Patent
Watanabe et al.

(10) Patent No.: US 8,030,706 B2
(45) Date of Patent: Oct. 4, 2011

(54) POWER SEMICONDUCTOR DEVICE

(75) Inventors: Miho Watanabe, Tokyo (JP); Masaru Izumisawa, Himeji (JP); Yasuto Sumi, Himeji (JP); Hiroshi Ohta, Himeji (JP); Wataru Sekine, Hemji (JP); Wataru Saito, Kawasaki (JP); Syotaro Ono, Yokohama (JP); Nana Hatano, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 163 days.

(21) Appl. No.: 12/540,192

(22) Filed: Aug. 12, 2009

(65) Prior Publication Data
US 2010/0038712 A1    Feb. 18, 2010

(30) Foreign Application Priority Data
Aug. 14, 2008 (JP) ................................. 2008-208910

(51) Int. Cl.
*H01L 29/66* (2006.01)
(52) U.S. Cl. ........ 257/341; 257/287; 257/401; 257/500; 257/E29.256
(58) Field of Classification Search .................. 257/287, 257/341, 401, 500, E29.256
See application file for complete search history.

(56) References Cited

U.S. PATENT DOCUMENTS
2008/0211020 A1    9/2008    Saito
2008/0246079 A1    10/2008    Saito et al.

FOREIGN PATENT DOCUMENTS
JP    2004-134714    4/2004
JP    2006-324432    11/2006

*Primary Examiner* — Tan N Tran
(74) *Attorney, Agent, or Firm* — Patterson & Sheridan, LLP

(57) ABSTRACT

A semiconductor device according to an embodiment of the present invention includes a device part and a terminal part. The device includes a first semiconductor layer, and second and third semiconductor layers formed on the first semiconductor layer, and alternately arranged along a direction parallel to a surface of the first semiconductor layer, wherein the device part is provided with a first region and a second region, each of which includes at least one of the second semiconductor layers and at least one of the third semiconductor layers, and with regard to a difference value $\Delta N$ ($=N_A-N_B$) obtained by subtracting an impurity amount $N_B$ per unit length of each of the third semiconductor layers from an impurity amount $N_A$ per unit length of each of the second semiconductor layers, a difference value $\Delta N_{C1}$ which is the difference value $\Delta N$ in the first region of the device part, a difference value $\Delta N_{C2}$ which is the difference value $\Delta N$ in the second region of the device part, and a difference value $\Delta N_T$ which is the difference value $\Delta N$ in the terminal part satisfy a relationship of $\Delta N_{C1} > \Delta N_T > \Delta N_{C2}$.

19 Claims, 5 Drawing Sheets

POWER SEMICONDUCTOR DEVICE

CROSS REFERENCE TO RELATED APPLICATION

This application is based upon and claims the benefits of priority from the prior Japanese Patent Application No. 2008-208910, filed on Aug. 14, 2008, the entire contents of which are incorporated herein by reference.

BACKGROUND OF THE INVENTION

1. Field of the Invention

The present invention relates to a power semiconductor device.

2. Background Art

A widely known example of a power transistor for handling high current is a vertical power MOSFET.

An on-resistance of the vertical power MOSFET largely depends on an electric resistance of a drift layer (conduction layer). The electric resistance of the drift layer changes according to a dopant concentration of the drift layer. To raise this dopant concentration, it is required to consider a breakdown voltage of a pn junction between the drift layer and a base layer. This is because the dopant concentration cannot be raised higher than a limiting concentration decided according to the breakdown voltage. In this way, a tradeoff relationship is present between the breakdown voltage and the on-resistance. There is a limit decided by materials of the device to realize both improvement in the breakdown voltage and suppression in the on-resistance.

As an example of a structure for solving this problem, there is known a super junction structure where n pillar layers and p pillar layers are buried in the drift layer. In the super junction structure, a pseudo undoped layer is formed by setting an impurity amount (charge amount) of each n pillar layer equal to that of each p pillar layer. Then, a current is applied via the heavily-doped n pillar layers, thereby realizing low on-resistance exceeding the material limitation while keeping the breakdown voltage high. To keep the high breakdown voltage, it is required to control the impurity amounts of the n pillar layers and the p pillar layers with high accuracy.

In a power semiconductor device where a MOSFET is formed on a drift layer of a super junction structure, the super junction structure is formed not only in a device part but also in a terminal part. However, in this case, there is a problem that it is difficult to set a breakdown voltage of the terminal part higher than that of the device part. In this case, if avalanche breakdown occurs, electric field locally concentrates on the terminal part, possibly resulting in breakdown of the terminal part.

JP-A 2004-134714 (KOKAI) discloses an example of a semiconductor device including parallel pn connection layers, each of which includes a p-type semiconductor region and an n-type semiconductor region, wherein an impurity concentration of a central portion of each semiconductor region is set higher than that of side portions of each semiconductor region. In a semiconductor region, the central portion is arranged apart from a junction plane between the semiconductor region and its adjacent semiconductor region, and the side portions are arranged closer to the junction plane.

Further, JP-A 2006-324432 (KOKAI) discloses an example of a semiconductor device including parallel pn connection layers, each of which includes a first conductivity type semiconductor layer and a second conductivity type semiconductor layer, wherein an impurity concentration of the second conductivity type semiconductor layer is 1.15 times or more as high as that of the first conductivity type semiconductor layer.

SUMMARY OF THE INVENTION

An aspect of the present invention is, for example, a power semiconductor device including a device part where a current flows in an on-state, and a terminal part which is provided around the device part, the device including a first semiconductor layer of a first conductivity type, second semiconductor layers of the first conductivity type and third semiconductor layers of a second conductivity type, formed on the first semiconductor layer, and alternately arranged along a direction parallel to a surface of the first semiconductor layer, a fourth semiconductor layer of the second conductivity type, selectively formed on surfaces of the second and third semiconductor layers, a fifth semiconductor layer of the first conductivity type, selectively formed on a surface of the fourth semiconductor layer, a control electrode formed on the second, fourth, and fifth semiconductor layers via an insulating layer, a first main electrode electrically connected to the fourth and fifth semiconductor layers, and a second main electrode electrically connected to the first semiconductor layer, wherein the device part is provided with a first region and a second region, each of which includes at least one of the second semiconductor layers and at least one of the third semiconductor layers, the first region and the second region being adjacent to each other in a direction parallel to the surface of the first semiconductor layer, and with regard to a difference value $\Delta N$ ($=N_A-N_B$) obtained by subtracting an impurity amount $N_B$ per unit length of each of the third semiconductor layers from an impurity amount $N_A$ per unit length of each of the second semiconductor layers, a difference value $\Delta N_{C1}$ which is the difference value $\Delta N$ in the first region of the device part, a difference value $\Delta N_{C2}$ which is the difference value $\Delta N$ in the second region of the device part, and a difference value $\Delta N_T$ which is the difference value $\Delta N$ in the terminal part satisfy a relationship of $\Delta N_{C1} > \Delta N_T > \Delta N_{C2}$.

DESCRIPTION OF THE EMBODIMENTS

Embodiments of the present invention will be described hereinafter with reference to the accompanying drawings.

First Embodiment

Figure 1:
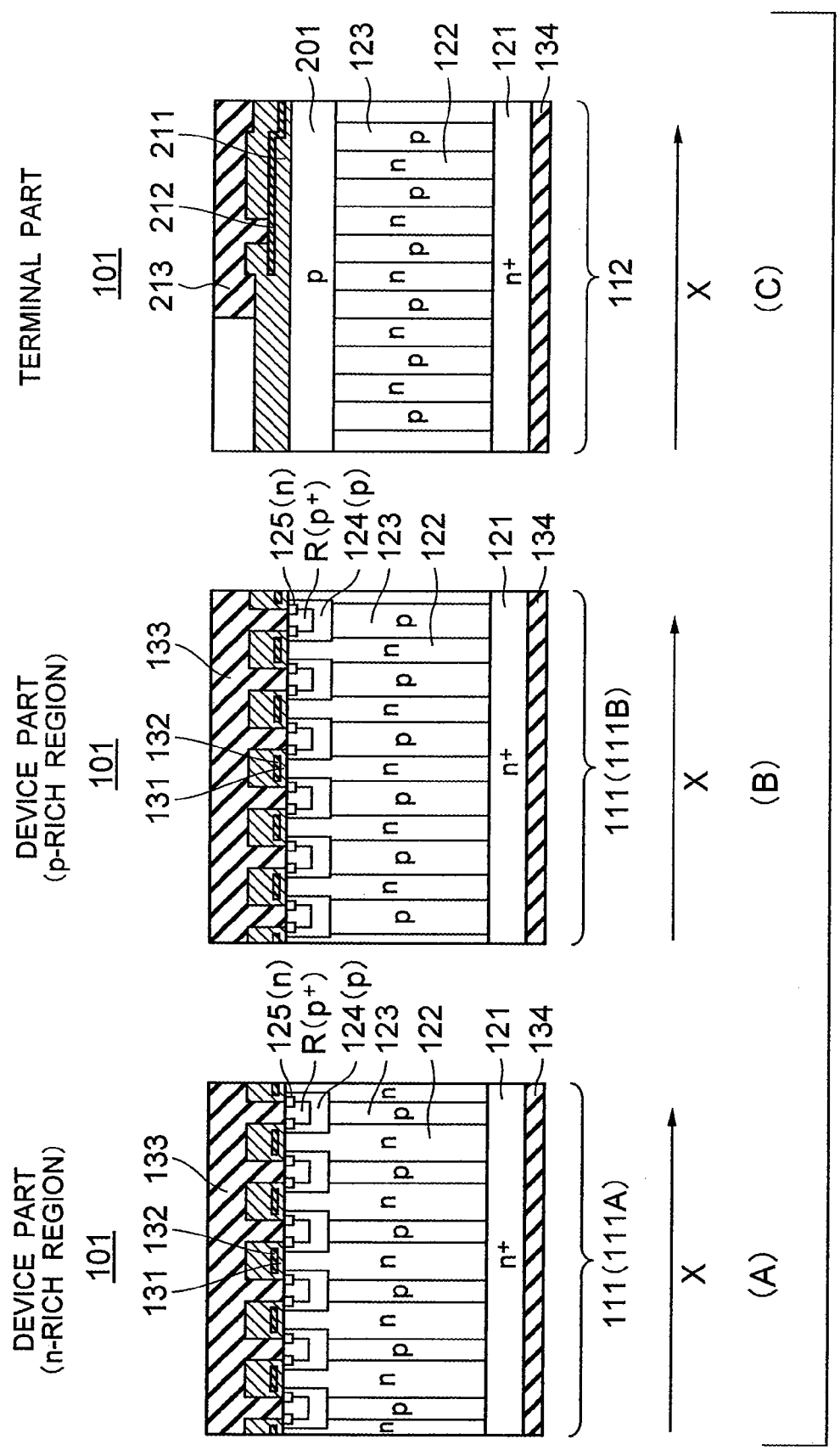
FIG. 1 is a side sectional view of a power semiconductor device according to a first embodiment.

FIG. 1 is a side sectional view of a power semiconductor device 101 according to a first embodiment. FIGS. 1(A) and 1(B) show a device part 111 where a current flows in an on-state, and FIG. 1(C) shows a terminal part 112 which is provided around the device part 111. The power semiconductor device 101 shown in FIG. 1 includes the device part 111 and the terminal part 112. The device part 111 is a region to which the current is applied in the on-state, whereas the terminal part 112 is a region surrounding the device part 111. The relationship between a region shown in FIG. 1(A) and a region shown in FIG. 1(B) will be described later.

The power semiconductor device 101 shown in FIG. 1 includes an n+ drain layer 121 as an example of a first semiconductor layer, n pillar layers 122 as an example of second semiconductor layers, p pillar layers 123 as an example of third semiconductor layers, p base layers 124 as an example of fourth semiconductor layers, n source layers 125 as an example of fifth semiconductor layers, gate insulators 131 as an example of insulating layers, gate electrodes 132 as an example of control electrodes, a source electrode 133 as an example of a first main electrode, and a drain electrode 134 as an example of a second main electrode. Each of the n-type semiconductor layers is an example of a first conductivity type semiconductor layer, whereas each of the p-type semiconductor layers is an example of a second conductivity type semiconductor layer.

In this embodiment, the n+ drain layer 121 is an n+ substrate. The n+ drain layer 121 is, for example, a semiconductor substrate such as a silicon substrate.

In the device part 111 and the terminal part 112, the n pillar layers 122 and the p pillar layers 123 are formed on the n+ drain layer 121, and alternately arranged along a direction parallel to a surface of the n+ drain layer 121. In FIG. 1, this direction is indicated by an arrow X. Impurities (donors) such as phosphorus atoms are implanted in the n pillar layers 122. On the other hand, impurities (acceptors) such as boron atoms are implanted into the p pillar layers 123.

In this way, in the device part 111, the n pillar layers 122 and the p pillar layers 123 form a drift layer of a super junction structure. Furthermore, in the device part 111, a vertical power MOSFET is formed on the drift layer. Furthermore, in this embodiment, the n pillar layers 122 and the p pillar layers 123 form the drift layer of the super junction structure not only in the device part 111 but also in the terminal part 112.

Figure 2:
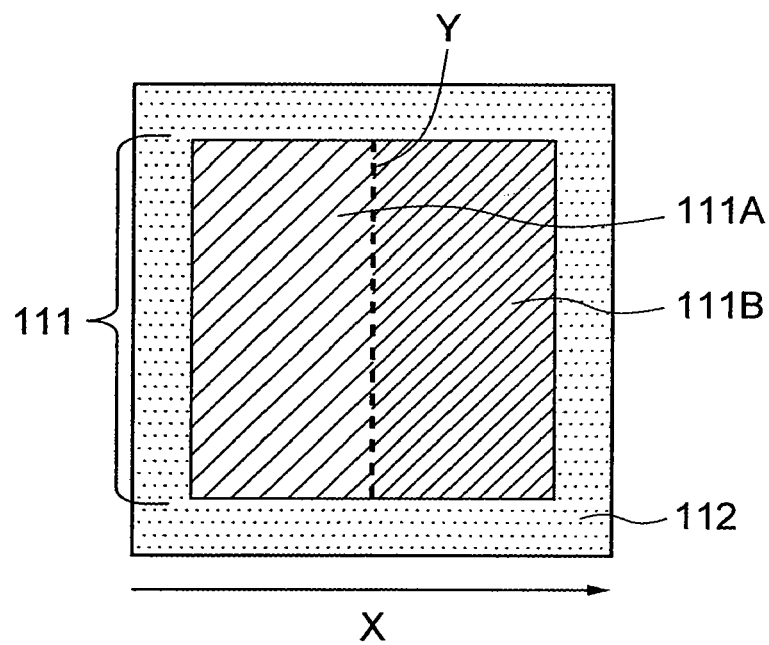
FIG. 2 is a top view of the power semiconductor device according to the first embodiment.

FIG. 2 is a top view of the power semiconductor device 101 shown in FIG. 1. FIG. 2 shows the device part 111 and the terminal part 112. An arrow X shown in FIG. 2 indicates a direction along which the n pillar layers 122 and the p pillar layers 123 are alternately arranged, similarly to the arrow X shown in FIG. 1.

The device part 111 is provided with an n-rich region 111A including the n pillar layers 122 and the p pillar layers 123, and a p-rich region 111B including the n pillar layers 122 and the p pillar layers 123. The n-rich region 111A and the p-rich region 111B are adjacent to each other in a direction parallel to the surface of the n+ drain layer 121.

As shown in FIG. 2, the device part 111 is divided into the n-rich region 111A and the p-rich region 111B by a boundary plane Y perpendicular to the surface of the n+ drain layer 121. In the n-rich region 111A, a relationship between an impurity amount per unit length of each of the n pillar layers 122 and an impurity amount per unit length of each of the p pillar layers 123 is n-rich. Further, in the p-rich region 111B, the relationship between the impurity amount per unit length of each of the n pillar layers 122 and the impurity amount per unit length of each of the p pillar layers 123 is p-rich. On the other hand, in the terminal part 112, the impurity amount per unit length of each of the n pillar layers 122 is substantially equal to the impurity amount per unit length of each of the p pillar layers 123.

In FIG. 1, the n-rich region 111A is shown in FIG. 1(A), and the p-rich region 111B is shown in FIG. 1(B). In this way, the n pillar layers 122 and the p pillar layers 123 in the device part 111 are divided into the n-rich region 111A and the p-rich region 111B by the boundary plane Y (FIG. 2). The n-rich region 111A is an example of a first region, and the p-rich region 111B is an example of a second region. Impurity amounts per unit length of the n-rich region 111A, the p-rich region 111B, and the terminal part 112 will be described later in detail.

Referring back to FIG. 1, the power semiconductor device 101 according to the first embodiment will be continuously described.

The p base layers 124 are selectively formed on the surfaces of the n pillar layers 122 and the p pillar layers 123 in the device part 111. In this embodiment, each of the p base layers 124 is formed into a stripe shape, and formed on n pillar layers 122 and a p pillar layer 123. As shown in FIGS. 1(A) and 1(B), each of the p base layers 124 includes a p+ region R in this embodiment.

The n source layers 125 are selectively formed on the surfaces of the p base layers 124 in the device part 111. In this embodiment, each of the n source layers 125 is formed into a stripe shape, and formed on a p base layer 124. As shown in FIGS. 1(A) and 1(B), each of the p base layers 124 includes a p+ region R and two n source layers 125, and each of these n source layers 125 is adjacent to the p+ region R.

The gate insulators 131 are formed on the n pillar layers 122, the p base layers 124, and the n source layers 125 in the device part 111. In this embodiment, each of the gate insulators 131 is a silicon oxide layer, and formed on an n pillar layer 122, p base layers 124, and n source layers 125.

The gate electrodes 132 are formed on the n pillar layers 122, the p base layers 124, and the n source layers 125 via the gate insulators 131 in the device part 111. In this embodiment, each of the gate electrodes 132 is a polysilicon electrode, and formed on an n pillar layer 122, p base layers 124, and n source layers 125 via a gate insulator 131. In this embodiment, each of the gate insulators 131 is unified with an insulating layer formed on an upper surface and side surfaces of a gate electrode 132. In this embodiment, the insulating layer is a silicon oxide layer.

The source electrode 133 is in contact with the p base layers 124 and the n source layers 125, and electrically connected to the p base layers 124 and the n source layers 125 in the device part 111. In this embodiment, the source electrode 133 is a metal electrode.

The drain electrode 134 is in contact with the n+ drain layer 121, and electrically connected to the n+ drain layer 121 in the device part 111 and the terminal part 112. The n pillar layers 122 and the p pillar layers 123 are formed on a first main surface of the n+ drain layer 121, whereas the drain electrode 134 is formed on a second main surface of the n+ drain layer 121. In this embodiment, the drain electrode 134 is a metal electrode.

In this embodiment, the n pillar layers 122 are formed on the n+ drain layer 121 which is a substrate. In this way, the n pillar layers 122 are formed on a substrate in this embodiment. Alternatively, in this embodiment, both the n+ drain layer 121 and the n pillar layers 122 may form a substrate. In this way, the n pillar layers 122 may be formed within a substrate in this embodiment.

Moreover, in this embodiment, the n pillar layers 122 and the p pillar layers 123 are formed on the n+ drain layer 121. Therefore, lower surfaces of the n pillar layers 122 and the p pillar layers 123 are in contact with an n+ layer (n+ drain layer 121) in this embodiment. Alternatively, in this embodiment, an n type layer may be formed on the n+ drain layer 121, and the n pillar layers 122 and the p pillar layers 123 may be formed on the n type layer. In this case, the lower surfaces of the n pillar layers 122 and the p pillar layers 123 are in contact with the n type layer. In this case, a stacked layer including the n+ drain layer 121 and the n type layer is an example of the first semiconductor layer.

The power semiconductor device 101 shown in FIG. 1 further includes a reduced surface field (RESURF) layer 201, a field insulator 211, a field plate electrode 212, and a field stop electrode 213 in the terminal part 112.

The RESURF layer 201 is a p-type semiconductor layer, and formed on the surfaces of the n pillar layers 122 and the p pillar layers 123. The RESURF layer 201 has an effect of improving a breakdown voltage of the terminal part 112. The field insulator 211 is formed simultaneously with the gate insulators 131. Also, the field plate electrode 212 is formed simultaneously with the gate electrodes 132. Also, the field stop electrode 213 is formed simultaneously with the source electrode 133. It is to be noted that the power semiconductor device 101 according to this embodiment does not always include the RESURF layer 201 and the field plate electrode 212.

The impurity amounts of the n-rich region 111A, the p-rich region 111B, and the terminal part 112 will be described.

Figure 9:
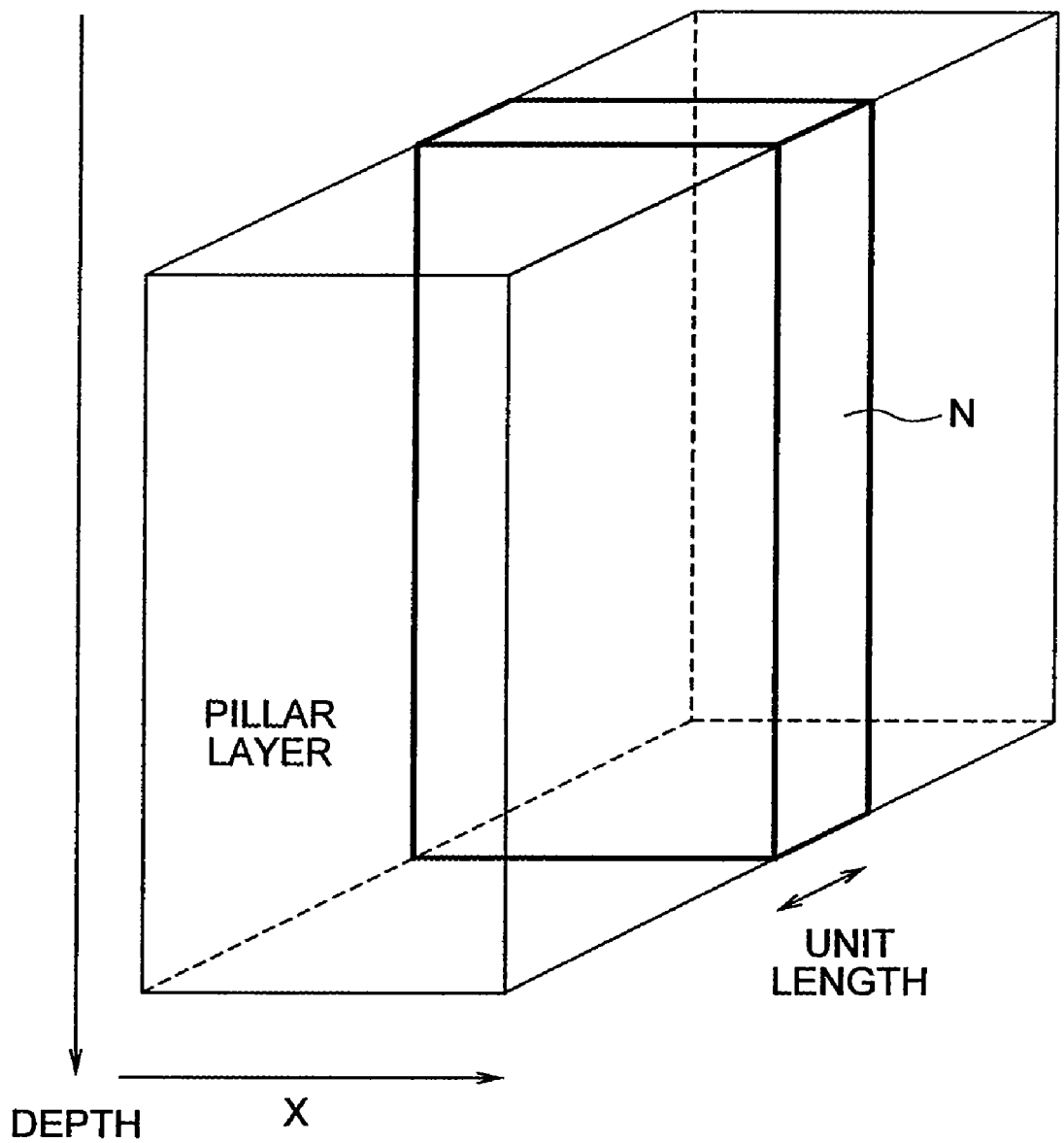
FIG. 9 is a schematic diagram for explaining an impurity amount per unit length.

FIG. 9 represents a pillar layer in the n-rich region 111A, the p-rich region 111B, or the terminal part 112. In FIG. 9, an impurity amount per unit length of the pillar layer is denoted by N. The unit length is a length in a direction parallel to the surface of the n+ drain layer 121 and perpendicular to a direction along which the n pillar layers 122 and the p pillar layers 123 are alternately arranged. The impurity amount N is represented in units of, for example, $cm^{-1}$. Hereinafter, the impurity amount per unit length of each of the n pillar layers 122 is denoted by Nn, and the impurity amount per unit length of each of the p pillar layers 123 is denoted by Np. The impurity amounts Nn and Np are examples of $N_A$ and $N_B$, respectively.

Referring back to FIG. 1, the power semiconductor device 101 according to this embodiment will be continuously described.

As described above, in the n-rich region 111A, the relationship between the impurity amount Nn per unit length of each of the n pillar layers 122 and the impurity amount Np per unit length of each of the p pillar layers 123 is n-rich. Accordingly, in the n-rich region 111A, a difference value $\Delta N$ (=Nn−Np) obtained by subtracting the impurity amount Np from the impurity amount Nn is a positive value.

Further, in the p-rich region 111B, the relationship between the impurity amount Nn and the impurity amount Np is p-rich. Accordingly, in the p-rich region 111B, the difference value $\Delta N$ obtained by subtracting the impurity amount Np from the impurity amount Nn is a negative value.

Further, in the terminal part (terminal region) 112, the impurity amount Nn is substantially equal to the impurity amount Np. Accordingly, in the terminal part 112, the difference value $\Delta N$ obtained by subtracting the impurity amount Np from the impurity amount Nn is substantially equal to zero.

In this embodiment, in the n-rich region 111A, the p-rich region 111B, and the terminal part 112, an impurity concentration per unit volume of each of the n pillar layers 122 is substantially equal to an impurity concentration per unit volume of each of the p pillar layers 123. In addition, in the n-rich region 111A, the width of each of the n pillar layers 122 is set greater than the width of each of the p pillar layers 123 as shown in FIG. 1(A), so that the difference value $\Delta N$ becomes a positive value. Further, in the p-rich region 111B, the width of each of the n pillar layers 122 is set smaller than the width of each of the p pillar layers 123 as shown in FIG. 1(B), so that the difference value $\Delta N$ becomes a negative value. Further, in the terminal part 112, the width of each of the n pillar layers 122 is set substantially equal to the width of each of the p pillar layers 123 as shown in FIG. 1(C), so that the difference value $\Delta N$ becomes substantially equal to zero.

In this way, in this embodiment, the n-rich region 111A and the p-rich region 111B are realized by making the impurity concentration of each n pillar layer 122 substantially equal to that of each p pillar layer 123, and making the width of each n pillar layer 122 different from that of each p pillar layer 123. However, these regions may be realized by another method. For example, the n-rich region 111A and the p-rich region 111B may be realized by making the width of each n pillar layer 122 substantially equal to that of each p pillar layer 123, and making the impurity concentration of each n pillar layer 122 different from that of each p pillar layer 123. In this case, the impurity concentration of each n pillar layer 122 becomes higher than that of each p pillar layer 123 in the n-rich region 111A, whereas the impurity concentration of each n pillar layer 122 becomes lower than that of each p pillar layer 123 in the p-rich region 111B. Also, the impurity concentration of each n pillar layer 122 becomes substantially equal to that of each p pillar layer 123 in the terminal part 112.

It is noted that the impurity amount N is represented in units of $cm^{-1}$ for example, whereas the impurity concentration is represented in units of $cm^{-3}$ for example. Further, the width of each of the n pillar layers 122 and the p pillar layers 123 is a width in a direction parallel to the arrow X.

Figure 6:
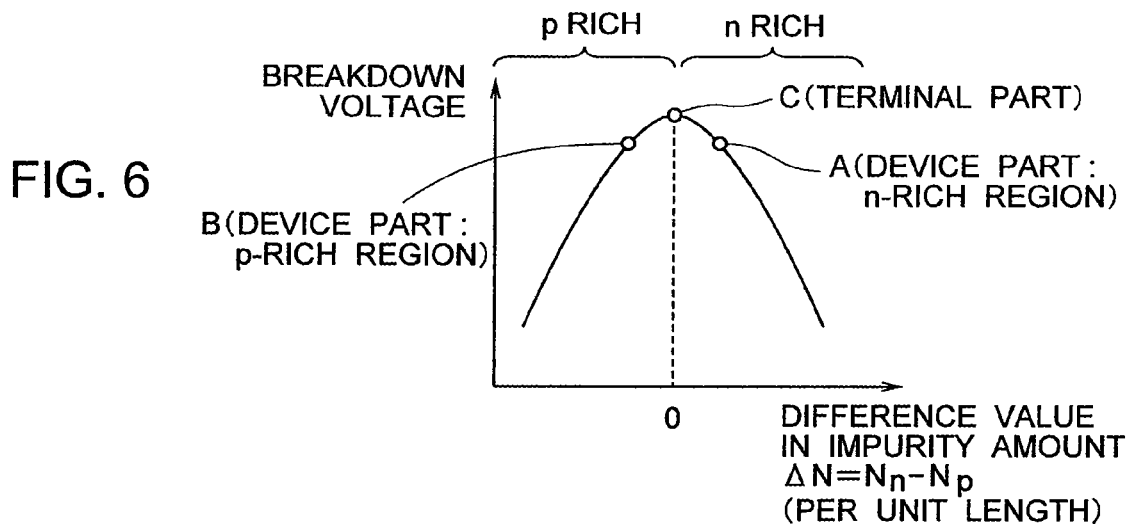
FIG. 6 is a graph showing a relationship between a difference value $\Delta N$ and a breakdown voltage of each region.

The above mentioned matters are shown in FIG. 6. FIG. 6 is a graph showing a relationship between the difference value $\Delta N$ and a breakdown voltage in each region. A vertical axis of FIG. 6 represents the breakdown voltage in each region, and a horizontal axis of FIG. 6 represents the difference value $\Delta N$ in each region. As described above, when the impurity amount per unit length of an n pillar layer 122 in each region is denoted by Nn and the impurity amount per unit length of a p pillar layer 123 in each region is denoted by Np, the difference value $\Delta N$ in each region is denoted by Nn−Np.

Points A, B, and C shown in FIG. 6 denote the n-rich region 111A, the p-rich region 111B, and the terminal part 112, respectively. In this embodiment, as indicated by the point A, the difference value $\Delta N$ in the n-rich region 111A is greater than zero. Furthermore, in this embodiment, as indicated by the point B, the difference value $\Delta N$ in the p-rich region 111B is greater than zero. Moreover, in this embodiment, as indicated by the point C, the difference value $\Delta N$ in the terminal part 112 is substantially equal to zero.

As shown in FIG. 6, the breakdown voltage in each region changes according to the difference value (per unit length) $\Delta N$ in each region. In addition, the breakdown voltage becomes higher as the absolute value of the difference value $\Delta N$ becomes smaller, and the breakdown voltage becomes the highest when the difference value $\Delta N$ is zero. Therefore, in this embodiment, the difference value ΔN in the terminal part 112 is set to zero, and those in the regions 111A and 111B of the device part 111 are shifted from zero. As a result, in this embodiment, the breakdown voltage in the terminal part 112 is higher than that in the device part 111. This can avoid local concentration of electric field on the terminal part 112 during avalanche breakdown. In this way, avalanche tolerance of the power semiconductor device 101 can be improved in this embodiment.

Figure 7:
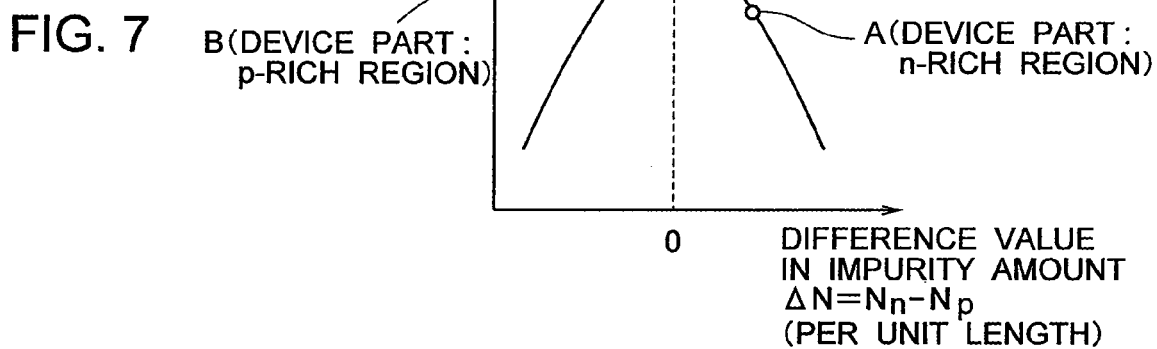
FIG. 7 is a graph showing the relationship between the difference value $\Delta N$ and the breakdown voltage of each region (in a case where an impurity amount is shifted to an n-rich side)
Figure 8:
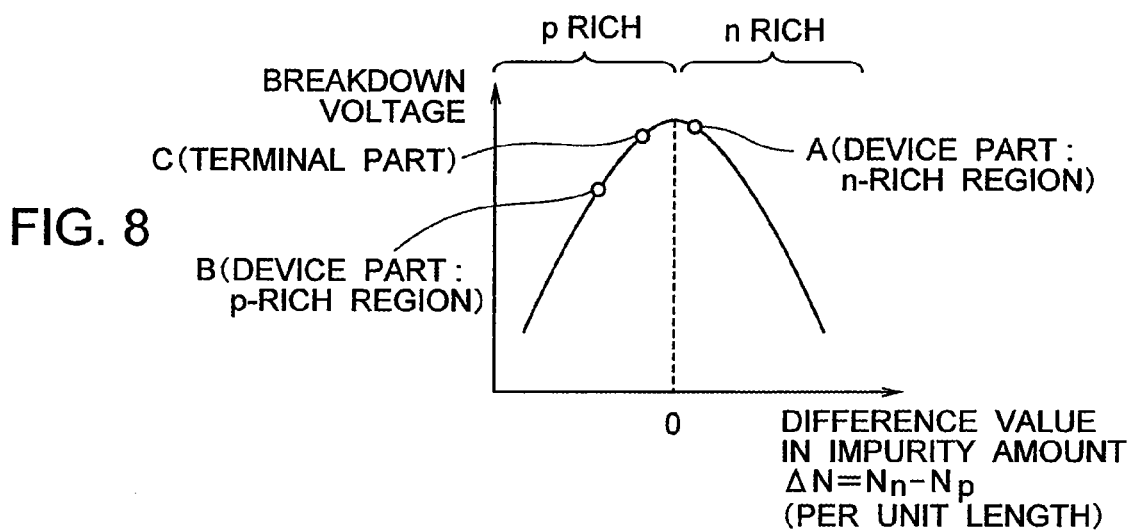
FIG. 8 is a graph showing the relationship between the difference value $\Delta N$ and the breakdown voltage of each region (in a case where an impurity amount is shifted to a p-rich side)

When manufacturing the power semiconductor device 101 of FIG. 1, the impurity amounts of the n pillar layers 122 and the p pillar layers 123 are often shifted from design values. FIG. 7 is a graph showing a case where the impurity amounts are shifted to an n-rich side, and FIG. 8 is a graph showing a case where the impurity amounts are shifted to a p-rich side. FIG. 6 corresponds to a graph showing a case where the impurity amounts are according to the design values. The shifts in the impurity amounts of the n-pillar layers 122 and the p pillar layers 123 cause the shifts in the difference values ΔN in the n-rich region 111A, the p-rich region 111B, and the terminal part 112 as shown in FIG. 7 or 8.

The graph of FIG. 7 will be described. In the case of FIG. 7, the difference value ΔN in the terminal part 112 is shifted in a positive direction from zero. Due to this, the breakdown voltage in the p-rich region 111B becomes often higher than that in the terminal part 112. This disturbs a setting that the breakdown voltage in the terminal part 112 is higher than that in the device part 111. However, in this embodiment, the n-rich region 111A is also provided in the power semiconductor device 101, and the breakdown voltage in the n-rich region 111A is lower than that in the terminal part 112. Due to this, in the case of FIG. 7, it is possible to avoid a situation in which the breakdown voltage in the terminal part 112 is the lowest among the three regions.

The same thing is also true for the case of FIG. 8. In the case of FIG. 8, the difference value ΔN in the terminal part 112 is shifted in a negative direction from zero. Due to this, the breakdown voltage in the n-rich region 111A becomes often higher than that in the terminal part 112. However, in this embodiment, the p-rich region 111B is also provided in the power semiconductor device 101, and the breakdown voltage in the p-rich region 111B is lower than that in the terminal part 112. Due to this, in the case of FIG. 8, it is also possible to avoid a situation in which the breakdown voltage in the terminal part 112 is the lowest among the three regions.

As described above, in this embodiment, the difference value ΔN in the n-rich region 111A is greater than zero, the difference value ΔN in the p-rich region 111B is smaller than zero, and the difference value ΔN in the terminal part 112 is substantially equal to zero. Thereby, even if the impurity amounts of the n pillar layers 122 and the p pillar layers 123 are shifted from the design values, the breakdown voltage in the terminal part 112 is higher than at least one of the breakdown voltages in the n-rich region 111A and the p-rich region 111B. As a result, even if the shifts in the impurity amounts occur, local concentration of electric field on the terminal part 112 during avalanche breakdown can be avoided. In other words, the effect of improving the avalanche tolerance can be maintained even if the shifts in the impurity amounts occur.

Such an effect can be attained even if the difference value ΔN in the terminal part 112 is set other than zero. For example, the effect can be attained by setting the relationship among the difference value $\Delta N_{C1}$ in the first region (n-rich region) 111A, the difference value $\Delta N_{C2}$ in the second region (p-rich region) 111B, and the difference value $\Delta N_T$ in the terminal part 112 to satisfy $\Delta N_{C1} > \Delta N_T > \Delta N_{C2}$. In this case, both of the first and second regions 111A and 111B may be n-rich, or both of them may be p-rich.

It is noted that a region where is n-rich can be realized, for example, by making the impurity concentration of each n pillar layer 122 substantially equal to that of each p pillar layer 123, and making the width of each n pillar layer 122 greater than that of each p pillar layer 123. Further, a region where is n-rich can also be realized, for example, by making the width of each n pillar layer 122 substantially equal to that of each p pillar layer 123, and making the impurity concentration of each n pillar layer 122 higher than that of each p pillar layer 123.

On the other hand, a region where is p-rich can be realized, for example, by making the impurity concentration of each n pillar layer 122 substantially equal to that of each p pillar layer 123, and making the width of each n pillar layer 122 smaller than that of each p pillar layer 123. Further, a region where is p-rich can also be realized, for example, by making the width of each n pillar layer 122 substantially equal to that of each p pillar layer 123, and making the impurity concentration of each n pillar layer 122 lower than that of eacc p pillar layer 123.

It is noted that these methods can be adopted to form each of the first region 111A, the second region 111B, and the terminal part 112.

Hereinafter, power semiconductor devices 101 according to second to fourth embodiments will be described. The second to fourth embodiments are modifications of the first embodiment. Therefore, the following description on the second to fourth embodiments will be focused on the points different from the first embodiment. It is to be noted that the side sectional view in FIG. 1 is common to the first to fourth embodiments.

Second Embodiment

Figure 3:
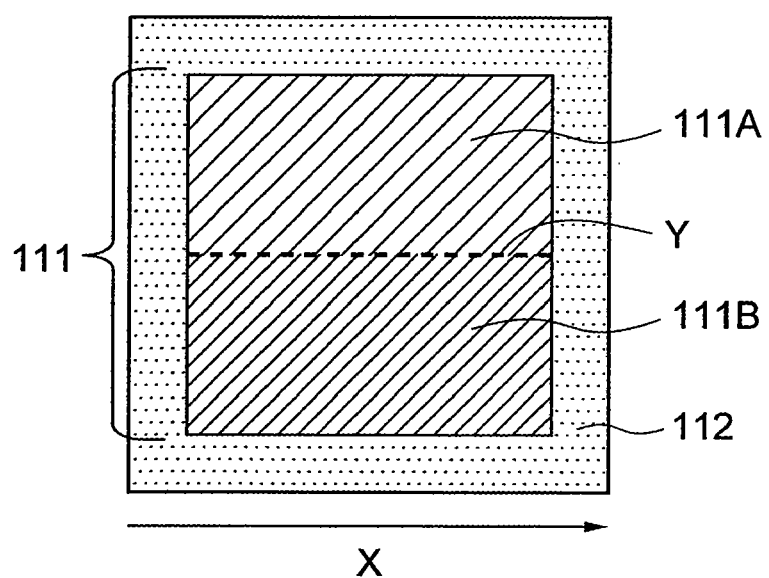
FIG. 3 is a top view of a power semiconductor device according to a second embodiment.

FIG. 3 is a top view of a power semiconductor device 101 according to a second embodiment. In FIG. 3, the device part 111 is divided into an n-rich region 111A and a p-rich region 111B by a boundary plane Y perpendicular the surface of to the n+ drain layer 121. In FIG. 3, the arrow X indicates the direction along which the n pillar layers 122 and the p pillar layers 123 are alternately arranged, similarly to the arrow X shown in FIG. 1.

FIGS. 2 and 3 will now be compared. In FIG. 2, the boundary plane Y extends in the direction perpendicular to the arrow X. On the other hand, in FIG. 3, the boundary plane Y extends in a direction parallel to the arrow X. Due to this, in FIG. 2, the n-rich region 111A is adjacent to the p-rich region 111B in the direction parallel to the arrow X, whereas, in FIG. 3, the n-rich region 111A is adjacent to the p-rich region 111B in the direction perpendicular to the arrow X. Due to such a structure of the power semiconductor device 101, the second embodiment can realize similar effects to those of the first embodiment. More specifically, in the second embodiment, even if the shifts in the impurity amounts occur, local concentration of electric field on the terminal part 112 can be avoided during occurrence of avalanche breakdown due to such a structure. It is to be noted that the boundary plane Y may extend in a direction other than the directions perpendicular and parallel to the arrow X. Furthermore, the boundary plane Y is not necessarily perpendicular to the surface of the n+ drain layer 121.

Third Embodiment

Figure 4:
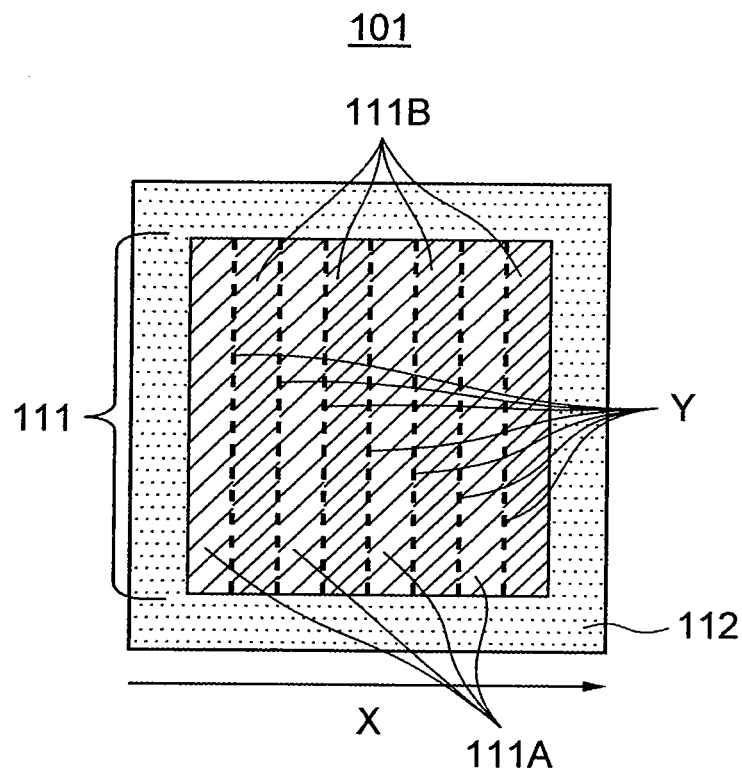
FIG. 4 is a top view of a power semiconductor device according to a third embodiment.

FIG. 4 is a top view of a power semiconductor device 101 according to a third embodiment. In FIG. 4, the device part 111 is divided into n-rich regions 111A and p-rich regions 111B by boundary planes Y perpendicular to the surface of the n+ drain layer 121. In FIG. 4, the arrow X indicates the direction along which the n pillar layers 122 and the p pillar layers 123 are alternately arranged, similarly to the arrow X shown in FIG. 1.

FIGS. 2 and 4 will now be compared. In FIG. 2, the device part 111 is divided into an n-rich region 111A and a p-rich region 111B by a boundary plane Y. On the other hand, in FIG. 4, the device part 111 is divided into plural n-rich regions 111A and plural p-rich regions 111B by plural boundary planes Y. In FIG. 4, the n-rich regions 111A and the p-rich regions 111B are alternately arranged along a direction parallel to the arrow X. Due to such a structure of the power semiconductor device 101, the third embodiment can realize similar effects to those of the first embodiment. More specifically, in the third embodiment, even if the shifts in the impurity amounts occur, local concentration of electric field on the terminal part 112 can be avoided during occurrence of avalanche breakdown due to such a structure.

Fourth Embodiment

Figure 5:
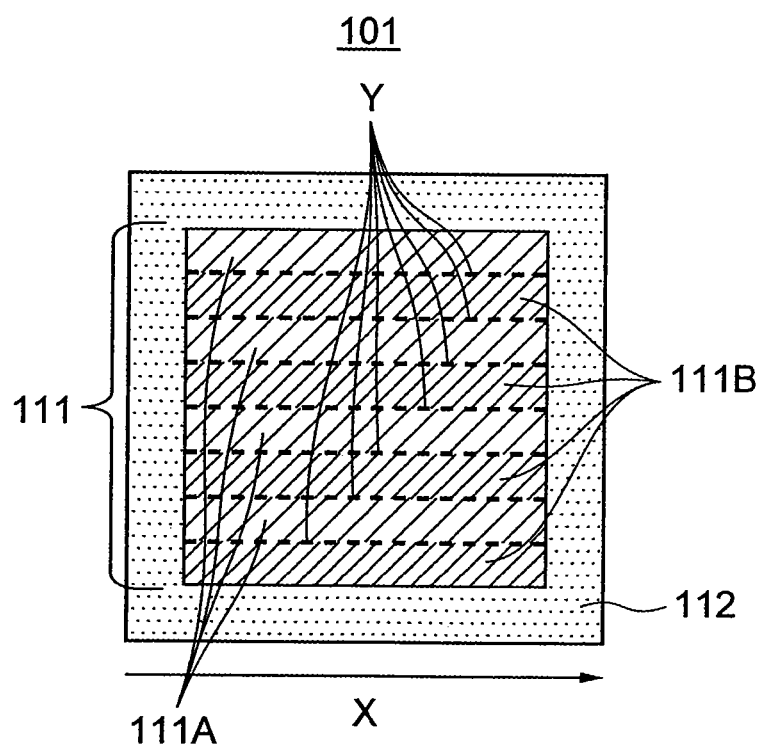
FIG. 5 is a top view of a power semiconductor device according to a fourth embodiment.

FIG. 5 is a top view of a power semiconductor device 101 according to a fourth embodiment. In FIG. 5, the device part 111 is divided into n-rich regions 111A and p-rich regions 111B by boundary planes Y perpendicular to the surface of the n+ drain layer 121. In FIG. 5, the arrow X indicates the direction along which the n pillar layers 122 and the p pillar layers 123 are alternately arranged, similarly to the arrow X shown in FIG. 1.

FIGS. 2 and 5 will now be compared. In FIG. 2, the device part 111 is divided into an n-rich region 111A and a p-rich region 111B by a boundary plane Y. On the other hand, in FIG. 5, the device part 111 is divided into plural n-rich regions 111A and plural p-rich regions 111B by plural boundary planes Y. In FIG. 5, the n-rich regions 111A and the p-rich regions 111B are alternately arranged along a direction perpendicular to the arrow X. Due to such a structure of the power semiconductor device 101, the fourth embodiment can realize similar effects to those of the first embodiment. More specifically, in the fourth embodiment, even if the shifts in the impurity amounts occur, local concentration of electric field on the terminal part 112 can be avoided during occurrence of avalanche breakdown due to such a structure.

In FIG. 4, the boundary planes Y extend in the direction perpendicular to the arrow X, whereas, in FIG. 5, the boundary planes Y extend in the direction parallel to the arrow X. The boundary planes Y in FIGS. 4 and 5 may extend in a direction other than the directions perpendicular and parallel to the arrow X. Furthermore, the boundary planes Y in FIGS. 4 and 5 are not necessarily perpendicular to the surface of the n+ drain layer 121. In FIG. 4, each of the n-rich regions 111A and the p-rich regions 111B has a stripe shape extending in the direction perpendicular to the arrow X, in a top view of these regions. In FIG. 5, each of the n-rich regions 111A and the p-rich regions 111B has a stripe shape extending in the direction parallel to the arrow X, in a top view of these regions.

Moreover, it is preferable that the boundary plane Y shown in FIG. 2 or each of the boundary planes Y shown in FIG. 4 coincides with a pn junction plane between an n pillar layer 122 and a p pillar layer 123. This can make the difference value relatively easy to control.

Furthermore, the number of the pillar layers 122 and 123 included in each of the regions 111A and 111B shown in FIGS. 2 to 5 may be arbitrarily set. Moreover, the pillar layers 122 and 123 have stripe shapes in a top view of these layers.

In FIG. 1, the pillar layers 122 and 123 have stripe shapes extending in a direction perpendicular to a sheet of FIG. 1. However, for example, these pillar layers 122 and 123 may have dot, zigzag, or mesh shapes in a top view of these layers.

As described above, a method of dividing the device part 111 into the n-rich region(s) 111A and the p-rich region(s) 111B has various modifications. The method of dividing the device part 111 is not limited to those described in the first to fourth embodiments. The boundary plane Y may be a lattice boundary plane obtained by combination of the boundary planes of FIG. 4 and the boundary planes of FIG. 5. In this case, the n-rich regions 111A and the p-rich regions 111B are arranged in a lattice pattern.

In the power semiconductor device 101 shown in FIG. 1, the MOSFET is formed in the device part 111. Alternatively, a transistor other than the MOSFET may be formed in the device part 111. Examples of such a transistor include an integrated gate bipolar transistor (IGBT). In this case, the source electrode 133 and the drain electrode 134 are replaced by an emitter electrode and a collector electrode, respectively. Besides, in this case, a p collector layer is provided as a constituent element of the transistor.

Furthermore, in the first to fourth embodiments, the MOSFET having an n-channel planar structure is referred to as an example of the transistor. Alternatively, the transistor may be a MOSFET having a p-channel planar structure. In another alternative, the transistor may be a MOSFET having an n-channel or a p-channel trench gate structure.

As described above, according to the embodiments of the present invention, the power semiconductor device including the device part and the terminal part can ensure an appropriate relationship between the breakdown voltage in the device part and that in the terminal part and thereby improve the avalanche tolerance.

Examples of specific aspects of the present invention have been described so far while referring to the first to fourth embodiments. However, the present invention is not limited to these embodiments. For example, shapes, dimensions, materials, conductivity types and the like of the respective elements in these embodiments may be appropriately selected from ranges well known to a person having ordinary skill in the art, and those which can exhibit similar functions and effects to these embodiments may be adopted. Various modifications obtained in this way are also included in embodiments of the present invention.

The invention claimed is:

1. A power semiconductor device including a device part where a current flows in an on-state, and a terminal part which is provided around the device part, the device comprising:
    a first semiconductor layer of a first conductivity type;
    second semiconductor layers of the first conductivity type and third semiconductor layers of a second conductivity type, formed on the first semiconductor layer, and alternately arranged along a direction parallel to a surface of the first semiconductor layer;
    a fourth semiconductor layer of the second conductivity type, selectively formed on surfaces of the second and third semiconductor layers;
    a fifth semiconductor layer of the first conductivity type, selectively formed on a surface of the fourth semiconductor layer;
    a control electrode formed on the second, fourth, and fifth semiconductor layers via an insulating layer;
    a first main electrode electrically connected to the fourth and fifth semiconductor layers; and
    a second main electrode electrically connected to the first semiconductor layer, wherein the device part is provided with a first region and a second region, each of which includes at least one of the second semiconductor layers and at least one of the third semiconductor layers, the first region and the second region being adjacent to each other in a direction parallel to the surface of the first semiconductor layer, and with regard to a difference value $\Delta N$ ($=N_A-N_B$) obtained by subtracting an impurity amount $N_B$ per unit length of each of the third semiconductor layers from an impurity amount $N_A$ per unit length of each of the second semiconductor layers, a difference value $\Delta N_{C1}$ which is the difference value $\Delta N$ in the first region of the device part, a difference value $\Delta N_{C2}$ which is the difference value $\Delta N$ in the second region of the device part, and a difference value $\Delta N_T$ which is the difference value $\Delta N$ in the terminal part satisfy a relationship of $\Delta N_{C1} > \Delta N_T > \Delta N_{C2}$.

2. The device according to claim 1, wherein the difference value $\Delta N_{C1}$ is greater than zero, and the difference value $\Delta N_{C2}$ is smaller than zero.

3. The device according to claim 2, wherein
in the first region, second region, and terminal part, an impurity concentration per unit volume of each of the second semiconductor layers is substantially equal to an impurity concentration per unit volume of each of the third semiconductor layers,
in the first region, a width of each of the second semiconductor layers is greater than a width of each of the third semiconductor layers, and
in the second region, a width of each of the second semiconductor layers is smaller than a width of each of the third semiconductor layers.

4. The device according to claim 2, wherein
in the first region, second region, and terminal part, a width of each of the second semiconductor layers is substantially equal to a width of each of the third semiconductor layers,
in the first region, an impurity concentration per unit volume of each of the second semiconductor layers is higher than an impurity concentration per unit volume of each of the third semiconductor layers, and
in the second region, an impurity concentration per unit volume of each of the second semiconductor layers is lower than an impurity concentration per unit volume of each of the third semiconductor layers.

5. The device according to claim 1, wherein the difference value $\Delta N_{C1}$ and the difference value $\Delta N_{C2}$ are greater than zero.

6. The device according to claim 1, wherein the difference value $\Delta N_{C1}$ and the difference value $\Delta N_{C2}$ are smaller than zero.

7. The device according to claim 1, wherein
in the terminal part, the impurity amount per unit length of each of the second semiconductor layers is substantially equal to the impurity amount per unit length of each of the third semiconductor layers.

8. The device according to claim 7, wherein
in the first region, second region, and terminal part, an impurity concentration per unit volume of each of the second semiconductor layers is substantially equal to an impurity concentration per unit volume of each of the third semiconductor layers, and in the terminal part, a width of each of the second semiconductor layers is substantially equal to a width of each of the third semiconductor layers.

9. The device according to claim 7, wherein
in the first region, second region, and terminal part, a width of each of the second semiconductor layers is substantially equal to a width of each of the third semiconductor layers, and
in the terminal part, an impurity concentration per unit volume of each of the second semiconductor layers is substantially equal to an impurity concentration per unit volume of each of the third semiconductor layers.

10. The device according to claim 1, wherein
in the terminal part, the impurity amount per unit length of each of the second semiconductor layers is more than the impurity amount per unit length of each of the third semiconductor layers.

11. The device according to claim 1, wherein
in the terminal part, the impurity amount per unit length of each of the second semiconductor layers is less than the impurity amount per unit length of each of the third semiconductor layers.

12. The device according to claim 1, wherein
the first region and the second region are adjacent to each other in a direction parallel to a direction along which the second and third semiconductor layers are alternately arranged.

13. The device according to claim 12, wherein
the device part is divided into the first region and the second region by a boundary plane which is perpendicular to the surface of the first semiconductor layer and extends in a direction perpendicular to the direction along which the second and third semiconductor layers are alternately arranged.

14. The device according to claim 13, wherein
the boundary plane coincides with a junction plane between one of the second semiconductor layers and one of the third semiconductor layers.

15. The device according to claim 1, wherein
the first region and the second region are adjacent to each other in a direction perpendicular to a direction along which the second and third semiconductor layers are alternately arranged.

16. The device according to claim 15, wherein
the device part is divided into the first region and the second region by a boundary plane which is perpendicular to the surface of the first semiconductor layer and extends in a direction parallel to the direction along which the second and third semiconductor layers are alternately arranged.

17. The device according to claim 1, wherein
the device part is provided with plural first regions and plural second regions including the first region and the second region, each of the plural first regions and the plural second regions including at least one of the second semiconductor layers and at least one of the third semiconductor layers.

18. The device according to claim 17, wherein
in a top view of the first and second regions, the first and second regions have stripe shapes.

19. The device according to claim 1, wherein
in a top view of the second and third semiconductor layers, the second and third semiconductor layers have stripe, dot, zigzag, or mesh shapes.

* * * * *